United States Patent [19]

Burns

[11] Patent Number: 5,140,188
[45] Date of Patent: Aug. 18, 1992

[54] HIGH SPEED LATCHING COMPARATOR USING DEVICES WITH NEGATIVE IMPEDANCE

[75] Inventor: Lawrence M. Burns, El Segundo, Calif.

[73] Assignee: Hughes Aircraft Company, Los Angeles, Calif.

[21] Appl. No.: 671,585

[22] Filed: Mar. 19, 1991

[51] Int. Cl.$^5$ .................. H03K 5/24; H03K 3/315
[52] U.S. Cl. ................. 307/362; 307/286; 307/322; 307/494; 307/502; 307/530
[58] Field of Search ............. 307/362, 286, 322, 283, 307/494, 502, 530

[56] References Cited

U.S. PATENT DOCUMENTS

| | | | |
|---|---|---|---|
| 3,122,649 | 2/1964 | Roop | 307/286 |
| 3,280,347 | 10/1966 | Blokker et al. | 307/286 |
| 3,315,089 | 4/1967 | Mayne | 307/286 |
| 3,441,746 | 4/1969 | Paradine | 307/286 |
| 3,622,805 | 11/1971 | McMorrow, Jr. | 307/286 |

FOREIGN PATENT DOCUMENTS

| | | | |
|---|---|---|---|
| 1126489 | 9/1968 | United Kingdom | 307/286 |

OTHER PUBLICATIONS

Weber, Samuel; "Will Quantum-Effect Technology Represent A Quantum Jump in ICs?"; *Electronics;* Oct. 1988; pp. 143-150.

Sze, S. M.; "Physics of Semiconductor Devices, 2Ed."; *John Wiley & Sons;* 1981; p. 237 and pp. 516-536.

General Electric Company; "Tunnel Diode Manual—Circuits, Applications, Specifications"; 1961; pp. 1-17.

Texas Instruments, Inc.; Bulletin No. DL-S 7311796, "P-N-P-N Silicon Programmable Unijunction Transistors"; Jan. 1973; pp. 4-431-4-436, and 5-181-5-182.

Hara, K., et al.; "Differential Optical Switching at Subnanowatt Input Power"; *IEEE Photonics Technology Letters,* vol. 1, No. 11; Nov. 1989; pp. 370-372.

Hara, K., et al.; "Differential Optical Comparator Using Parallel Connected AlGaAs pnpn Optical Switches"; *Electronics Letters;* Mar. 30, 1989; vol. 25, No. 7; pp. 433-434.

Taylor, Geoffrey W., et al.; "Electrical Switching Speed of the Double-Heterostructure Optoelectronic Switch"; *IEEE Transactions on Electron Devices, vol. ED-34, No. 5, May 1987; pp. 961-965.*

Primary Examiner—John Zazworsky
Attorney, Agent, or Firm—Jeannette M. Walder; Terje Gudmestad; W. K. Denson-Low

[57] ABSTRACT

A latching comparator circuit employs latching devices having a region of negative impedance separating regions of higher and lower positive impedance, such as resonant tunnel diodes, to significantly increase operating speed. The latching devices are biased so that one of them is triggered into its higher voltage region of positive impedance when a latching operation is desired, and the other is held in its lower voltage region of positive impedance. Hysteresis elements drive the triggered device to a lower voltage level within its higher voltage region, while a cross-coupling circuit between the latching devices holds the non-triggered device in its lower voltage region below its trigger level, thus assuring circuit stability.

7 Claims, 5 Drawing Sheets

HIGH SPEED LATCHING COMPARATOR USING DEVICES WITH NEGATIVE IMPEDANCE

BACKGROUND OF THE INVENTION

1. Field of the Invention

This invention relates to latching comparator circuits for use in devices such as analog-to-digital converters (ADCs), and more particularly to high speed latching comparator circuits that utilize devices such as tunnel diodes having a region of negative impedance separating high and low voltage regions of positive impedance.

2. Description of the Related Art

Latching comparator circuits are used in applications such as ADCs and flip-flop circuits. However, their switching speed has been limited, which imposes a corresponding limitation upon the speed of the device into which they are incorporated.

The circuit design for a conventional latching comparator such as that used in a parallel ("flash") ADC is shown in FIG. 1. A differentially-connected input transistor pair Q1, Q2 is respectively biased by input and reference voltages. The transistors are connected to a positive voltage bus $V_{cc}$ through respective load resistors $R_{L1}$ and $R_{L2}$. While illustrated as npn bipolar devices, the transistors could also be pnp bipolars or field effect transistors. Complementary logic outputs $V_o$ and $\overline{V}_o$ are taken from the collectors of Q2 and Q1, while a pair of regenerative latching transistors Q3, Q4 latch the logic outputs in the states established by the input pair. The base and collector of Q3 are connected to $V_o$ and $\overline{V}_o$ respectively, while the base and collector of Q4 are connected to $\overline{V}_o$ and $V_o$ respectively. Q3 and Q4 have their emitters connected together as a differential pair.

A third differential transistor pair Q5, Q6 supplies current to differential pairs Q1, Q2 and Q3, Q4. Current is supplied to the Q5, Q6 pair in turn by a current source $I_{s1}$. When used in an ADC, Q5 is gated ON and Q6 OFF during a TRACK mode in which the $V_{IN}$ bias signal for Q1 tracks the varying input analog signal, while Q6 is gated ON and Q5 OFF during a LATCH mode to obtain a sample of the input analog signal value at the beginning of the LATCH mode. The alternation between TRACK and LATCH is governed by a clock circuit (not shown).

Assume that $V_{IN}$ is lower than $V_{REF}$ immediately prior to LATCH. More current will accordingly flow through Q2 than through Q1. Since the current through $R_{L2}$ will also be higher than the current through $R_{L1}$, $R_{L2}$ will experience a greater voltage drop than $R_{L1}$, setting $V_o$ LOW and $\overline{V}_o$ HIGH. At the commencement of the LATCH cycle, the base of Q4 will thus be biased HIGH and the base of Q3 LOW. This turns Q4 on and Q3 off as Q6 is gated. The current through Q4 continues to generate a large voltage drop across $R_{L2}$, keeping $V_o$ LOW. Conversely, the lack of current flow through Q3 results in a low or zero voltage drop across $R_{L1}$, keeping $\overline{V}_o$ HIGH. The circuit is thus latched at the logic output existing at the beginning of the sample period, until the commencement of the next TRACK cycle.

The speed of operation for the FIG. 1 circuit is not optimum. To make the transition from TRACK to LATCH, the Q1, Q2 pair must be discharged and turned off, the Q3, Q4 pair must be energized, and a further delay is required for the Q3, Q4 pair to regenerate to the final logic value. To go from LATCH to TRACK, the Q3, Q4 pair must be discharged from a hard saturation state and turned off, the Q1, Q2 pair must be charged and turned on, and a further delay is encountered while the currents through Q1 and Q2 settle before reverting to LATCH again. This limits the ADCs in which the latching comparators are used to lower frequency signal processing and communication systems. It would be very desirable to advance the ADCs into the high frequency portions of such systems where very high frequency signals must be digitized.

SUMMARY OF THE INVENTION

The present invention seeks to provide a high speed latching circuit that can be used in a comparator to provide a much higher switching rate than has previously been obtainable. When applied to an ADC, a low level of dynamic and DC distortion is also sought.

These goals are accomplished by designing a high speed latching circuit with a pair of latching devices, such as tunnel diodes, that are characterized by higher and lower voltage regions of positive electrical impedance separated by a region of negative electrical impedance. The latching devices are triggered from their lower to their higher voltage regions of positive impedance in response to their currents exceeding a trigger level. Respective currents are supplied to the latching devices in accordance with an input and a reference signal, while a cross-coupling circuit diverts current away from a latching device in its voltage region when the other latching device has triggered, thus latching the first device in its low voltage region. Hysteresis elements, preferably series impedances, are connected to the latching devices to maintain them in their higher voltage regions of positive impedance, but at a lower voltage than the initial higher voltage region trigger voltage; this prevents the circuit from oscillating.

In a preferred embodiment the latching devices are implemented by tunnel diodes, with their inputs and outputs cross-coupled by a pair of impedances, and with additional impedances connected in series with the tunnel diodes to provide the hysteresis effect. The tunnel diodes are connected in opposite branches of a differential amplifier. A trigger current is applied to the differential amplifier and is steered to one or the other of the diodes, causing it to trigger. When one tunnel diode triggers, current is diverted away from the other diode by the cross-coupling circuit, thus latching the non-triggered diode in an untriggered state. The series impedance for the triggered diode causes the current through that diode to drop when it enters its higher voltage positive impedance region, thus latching the diode in a triggered state.

The new latching comparator circuit makes it possible to greatly increase the speed of ADCs and other circuits, without loss of fidelity or accuracy. The new circuit approach does not increase power consumption, and actually reduces the size and complexity of the required circuitry.

Further features and objects of the invention will be apparent to those skilled in the art from the following detailed description, taken together with the accompanying drawings, in which:

DETAILED DESCRIPTION OF THE INVENTION

Figure 1:
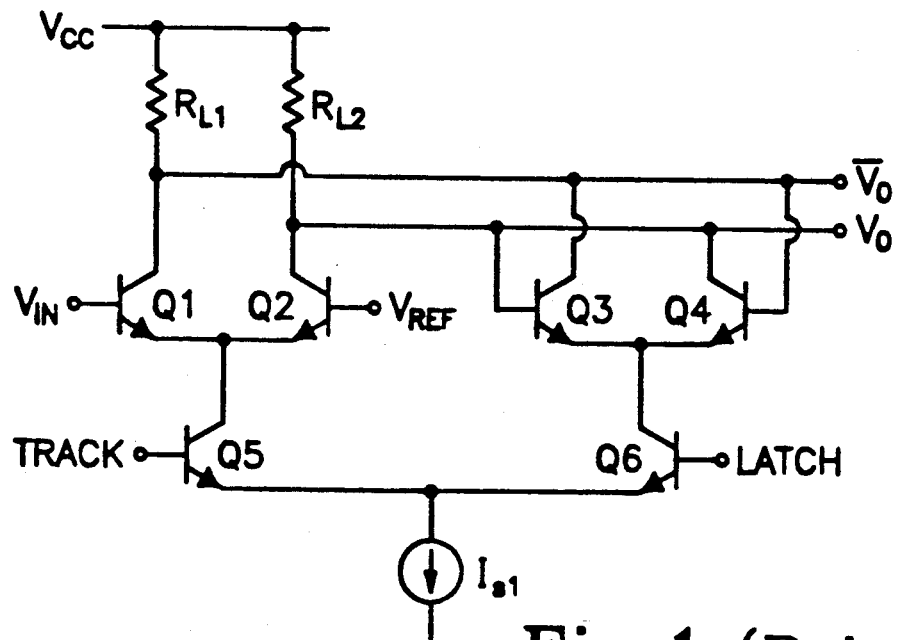
FIG. 1 is a circuit diagram of a conventional latching comparator circuit, described above.

The circuit of FIG. 1 relies upon conventional transistors such as bipolar or FET devices. A different class of devices that has been the subject of investigation recently is quantum devices, including both resonant tunneling transistors and resonant tunneling diodes. Such devices are discussed, for example, in Weber, "Will Quantum-Effect Technology Represent a Quantum Jump in ICs?", *Electronics*, Oct., 1988, pages 143-150; tunnel diodes are further discussed in Sze, "Physics of Semiconductor Devices, 2Ed.", *John Wiley & Sons*, 1981, pages 516-536, and General Electric Company, "Tunnel Diode Manual—Circuits, Applications, Specifications", 1961, pages 1-17.

Figure 2:
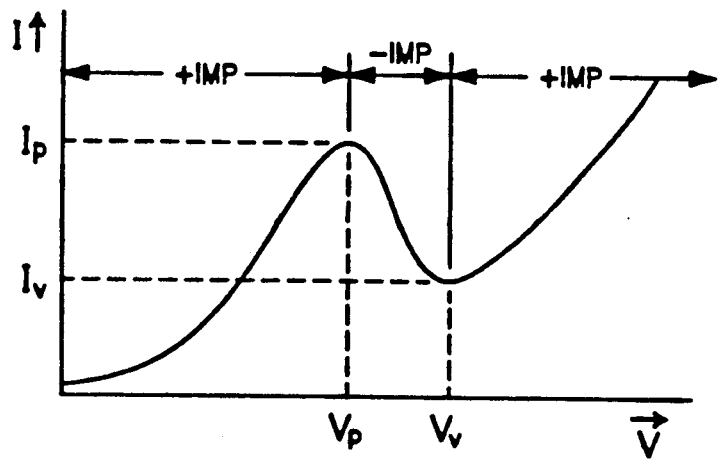
FIG. 2 is a graph of the voltage-current characteristic for a typical tunnel diode.

A representative voltage-current characteristic for this type of device is illustrated in FIG. 2. The voltage and current initially increase together in a low voltage region of positive impedance until a peak voltage $V_p$ and peak current $I_p$ are reached. As the voltage continues to increase, the device enters a region of negative impedance in which the current progressively decreases until a minimum (valley) current $I_v$ is reached at a voltage $V_v$. Thereafter the current increases exponentially with voltage in a high voltage region of positive impedance. A tunneling device does not require charging or discharging, and therefore has the potential for a much faster operation than a more conventional switching device.

Other devices that also exhibit a region of negative impedance between high and low voltage regions of positive impedance include programmable unijunction transistors (Sze, "Physics of Semiconductor Devices 2d. Ed.", *John Wiley & Sons*, 1981, page 237; Texas Instruments, Inc. Bulletin No. DL-S 7311796, "P-N-P-N Silicon Programmable Unijunction Transistors", Jan., 1973, pages 4-431-4-436, 5-181, 182, "The Transistor and Diode Data Book for Design Engineers", *Texas Instruments, Inc.*, 1973, pages 1-16, 27 and 28); four-layer pnpn optoelectronic devices used in differential optical switching (Hara et al., "Differential Optical Switching at Subnanowatt Input Power", *IEEE Photonics Technology Letters*, Vol. 1, No. 11, Nov., 1989, pages 370-372; Hara, et al., "Differential Optical Comparator Using Parallel Connected AlGaAs pnpn Optical Switches", *Electronics Letters*, 30 Mar. 1989, Vol. 25, No. 7, pages 433-434); and a double heterostructure optoelectronics switch with the acronym DOES (Taylor, et al. "Electrical Switching Speed of the Double Heterostructure Optoelectronics Switch, *IEEE Transactions on Electron Devices*, Vol. Ed-34, No. 5, May, 1987, pages 961-965). Such devices can also be used for the invention.

Figure 3:
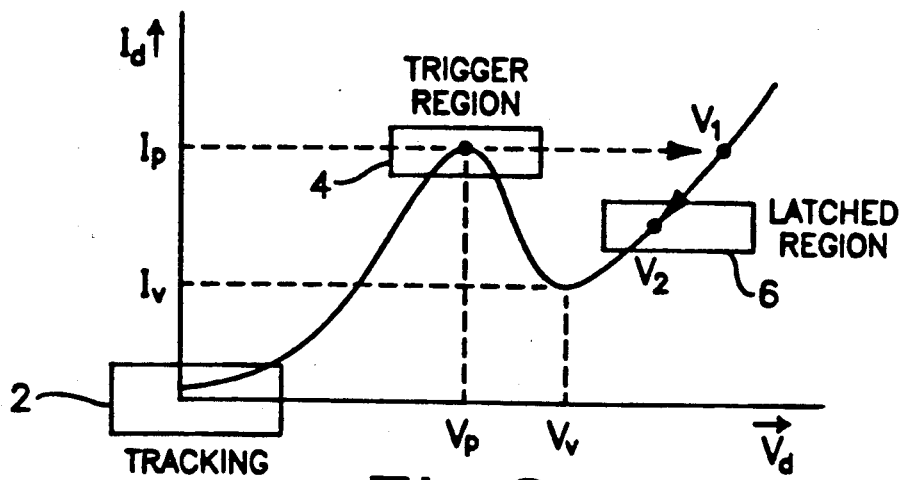
FIG. 3 is a graph similar to FIG. 2, illustrating the application of a tunnel diode to the invention.

The use made by the invention of a tunnel diode, or other device having a voltage-current characteristic with a region of negative resistance separating higher and lower voltage regions of positive impedance, is illustrated in FIG. 3. The illustrated application is for a pair of tunnel diodes in opposite branches of a differential amplifier that is used in a latching comparator circuit for an ADC. The current division between the two tunnel diodes is governed by the relative values of a reference voltage applied to one branch, and an analog input voltage signal applied to the other branch. During the TRACK phase when the comparator input voltage follows the analog signal, the currents through both tunnel diodes are kept at low levels within the "tracking region" 2 illustrated in the figure. When the circuit is switched to the LATCH mode, a bias current slightly above $I_p$ is added to the circuit; this bias current will be within the "trigger region" 4 illustrated in the figure for one diode. Its magnitude is selected such that, when added to the greater of the currents carried by the two tunnel diodes at the instant of LATCH, the total current through that tunnel diode will exceed $I_p$, while the total current through the other tunnel diode remains less than $I_p$. This causes the diode carrying the greater current to trigger and suddenly jump from $V_p$ to $V_1$ at the same $I_p$ in the higher voltage region of positive impedance. This transition occurs at an extremely rapid rate, due to the quantum tunneling effect. In a typical circuit the transition time is normally limited only by the external circuit parasitics, and at least theoretically will permit a switching rate on the order of 2,500 GHz with currently available diodes.

To prevent the triggered diode from retriggering or perhaps oscillating, a hysteresis element is added to the circuit that causes the voltage across the triggered diode to drop down to $V_2$ within the "latched region" 6, below $I_p$ but above $I_v$. Since diode current excursions from the changing input analog signal are much less than the applied bias current, the current through the triggered tunnel diode cannot fall below $I_v$, and the diode therefore latches in a stable triggered state. Furthermore, a special crosscoupling circuit described below is provided that reduces the current through the non-triggered tunnel diode in response to the positive voltage jump for the triggered diode. This causes the non-triggered device to latch at an operating point below the trigger region 4, so that fluctuations in the analog input signal cannot thereafter raise its current high enough to trigger. The circuit is thus latched in a stable state, with one tunnel diode held triggered and the other non-triggered, regardless of the changing value of the input analog signal. The circuit remains in this latched state, based upon the value of the analog signal at the beginning of the LATCH period, until it is reset back to a TRACK mode by allowing the current to fall below $I_v$.

Figure 4:
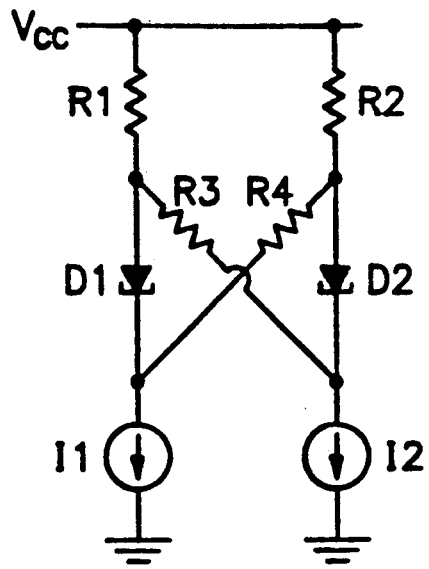
FIG. 4 is a circuit diagram illustrating the basic latching concept of the invention.

A circuit that implements this basic inventive concept for a two-diode latching comparator is shown in FIG. 4. Two tunnel diodes D1 and D2 have their input sides connected respectively through resistors R1 and R2 to a positive voltage bus $V_{cc}$. Current sources I1 and I2 are connected to the output sides of D1 and D2 respectively, and supply currents thereto. The input and output sides of D1 and D2 are cross-coupled by a pair of resistors R3 and R4.

Assume that I1 increases so that the current through D1 exceeds its trigger level $I_p$, while the current through D2 remains below $I_p$. This causes D1 to trigger and jump from voltage level $V_p$ to $V_1$. Since R1 and D1 are connected in series, they function as a voltage divider so that the increase in voltage across D1 produces a corresponding reduction in the voltage across R1. This reduces the current through R1, and thus through D1, causing D1 to settle within the latched region 6 of FIG. 3 at a somewhat lower level of voltage and current. R1 and R2 thus function as hysteresis elements that cause the triggered diode to enter the stable latched region 6.

The reduction in the R1/D1 current means that I1 must also now draw part of its current from an additional source. This additional current is provided from the positive voltage bus through R2 and cross-coupling resistor R4. The current through R4, which increases the voltage drop across R4, is diverted away from D2, thus reducing the D2 current so that D2 operates in an area safely below the trigger region 4 of FIG. 3. The reduction in current to D2 causes I2 to draw a compensating amount of current through R1 and R3. This in turn further reduces the current through D1, and thus D2, with the two diodes settling within securely latched operating regions; the triggered diode remains triggered, and the other diode is prevented from triggering.

Figure 5:
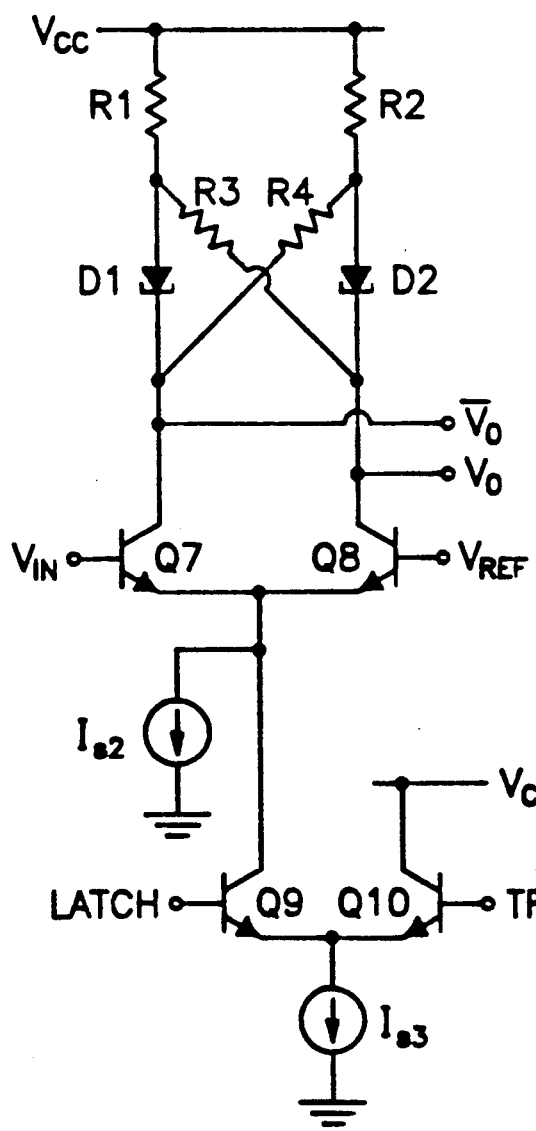
FIG. 5 is a circuit diagram of a latching tunnel diode comparator in accordance with the invention.

A functional latching comparator circuit using the invention is shown in FIG. 5. It employs the same latching network as in FIG. 4, consisting of tunnel diodes D1, D2 and resistors R1-R4. A pair of transistors Q7, Q8 are differentially connected, with one transistor in each branch of the latched circuit. Q7 is biased by the input analog signal $V_{IN}$, while Q8 is biased by a reference voltage $V_{REF}$. A low level current source $I_{s2}$ at the common emitter connection of Q7 and Q8 supplies sufficient current to keep Q7 and Q8 charged within the tracking region 2 during the TRACK cycles. Maintaining the transistors in their linear regions of operation saves the time that might otherwise be required to charge the transistors when the LATCH mode is entered.

A pair of differentially connected transistors Q9, Q10 are biased by the LATCH and TRACK signals, respectively. A current source $I_{s3}$ provides a current to these transistors that, when combined with the current from $I_{s2}$, is slightly greater than the peak current $I_p$ at which the tunnel diodes trigger. The LATCH transistor Q9 draws current from the Q7, Q8 differential pair, while the TRACK transistor Q10 is connected to the positive voltage bus. When a LATCH signal is applied to Q9 and the TRACK signal removed from Q10, the current of $I_{s3}$ flows through Q9 and the latching comparator circuit, which operates as described above in connection with FIG. 4. When the analog signal $V_{IN}$ exceeds $V_{REF}$, Q7 conducts more current than Q8, causing tunnel diode D1 to trigger and the voltage across R1/D1 to increase to a level above the voltage drop across R2/D2. The voltage at the collector of Q8 thus becomes higher than the voltage at the collector of Q7. Outputs are taken from the collectors of both transistors, with the output $V_o$ from Q8 indicating the presence of an analog input signal higher than the reference voltage, and the $\overline{V}_o$ output from Q7 indicating the absence of such an input analog signal.

The differential amplifiers Q7/Q8 and Q9/Q10 respond at a much slower rate than do tunnel diodes D1 and D2. The current increase through the diodes upon the commencement of LATCH thus appears as a ramp rather than a step increase. The diode receiving the greater current will trigger virtually immediately upon its current reaching $I_p$. This causes current to be diverted away from the other diode to prevent the other diode from triggering, and also sends the triggered diode down its hysteresis curve as described above to a stable operating point. The value of $I_{s3}$ is selected so that it is high enough to trigger one of the diodes for all permissible $V_{IN}/V_{REF}$ ratios.

The transistors in the latching circuit are preferably implemented as npn heterojunction bipolar devices. When used in conjunction with resonant tunneling diodes, a very large increase in speed can be achieved in the ADC sampling rate; operation in excess of 50 Ghz is theoretically possible. In addition to an increase in the sample rate, the ADC will also be smaller in size. This is important because at the extremely high frequencies at which the ADC operates, the wavelength of the signal begins to approach the size of the device. Thus, the integrated circuit components must now be treated as distributed elements.

While npn heterojunction bipolar transistors are preferred, it should be understood that the circuit of FIG. 5 could also be implemented with devices of opposite conductivity. In that case the voltage busses would also be reversed.

Figure 6:
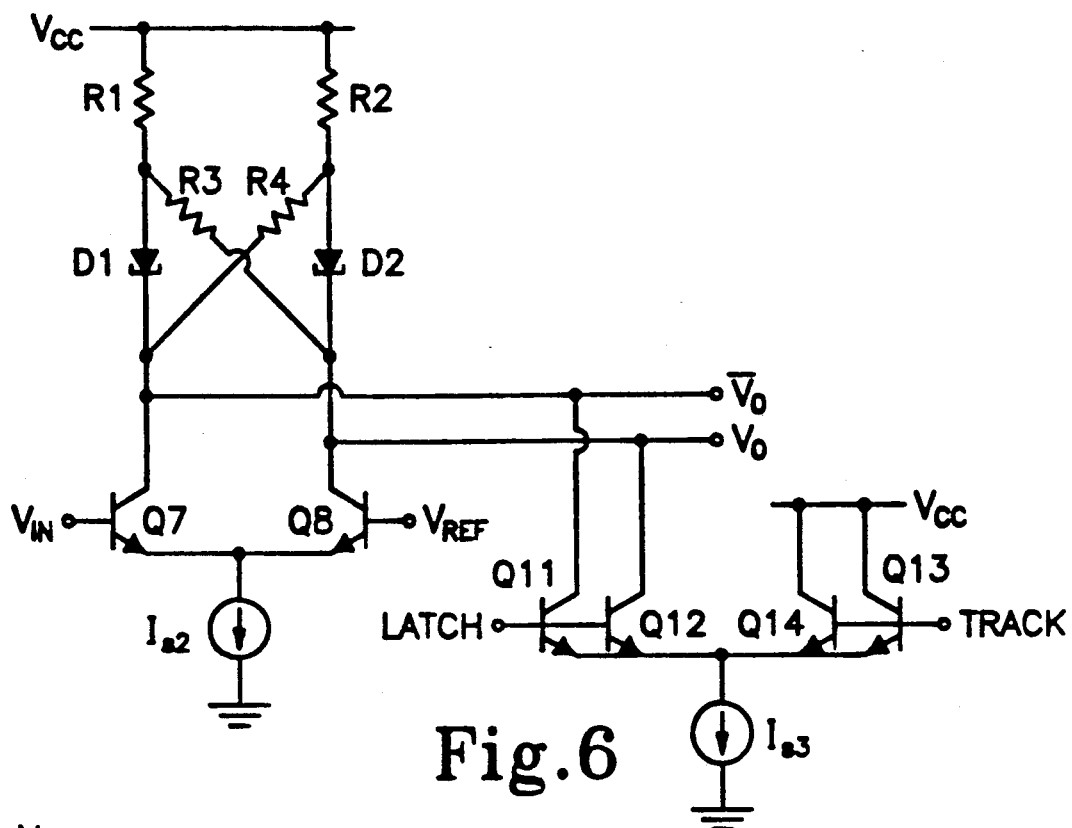
FIGS. 6 and 7 are circuit diagrams of alternate embodiments of latching tunnel diode comparators.

A variation of the latching comparator circuit is shown in FIG. 6. In this circuit, the large bias current $I_{s3}$ bypasses Q7 and Q8, thereby eliminating the large increase in current through these devices during LATCH. $I_{s3}$ draws current from D1 and D2 during LATCH through transistors Q11 and Q12, respectively, which are biased into conduction by the presence of a LATCH signal. During TRACK, the $I_{s3}$ current is supplied from the positive voltage bus through matching transistors Q13 and Q14.

The purpose of the FIG. 6 variation is to avoid any possibility of having to charge or discharge Q7 and Q8 when switching between LATCH and TRACK, and to avoid a base current kickback that might otherwise occur during switching and that can produce settling effects in Q7 and Q8 that degrade their switching speed. However, the circuit of FIG. 6 requires additional transistors that add parasitic capacitance to the nodes at the collectors of Q7 and Q8, and therefore in a particular case might result in a net reduction in operating speed.

Figure 7:
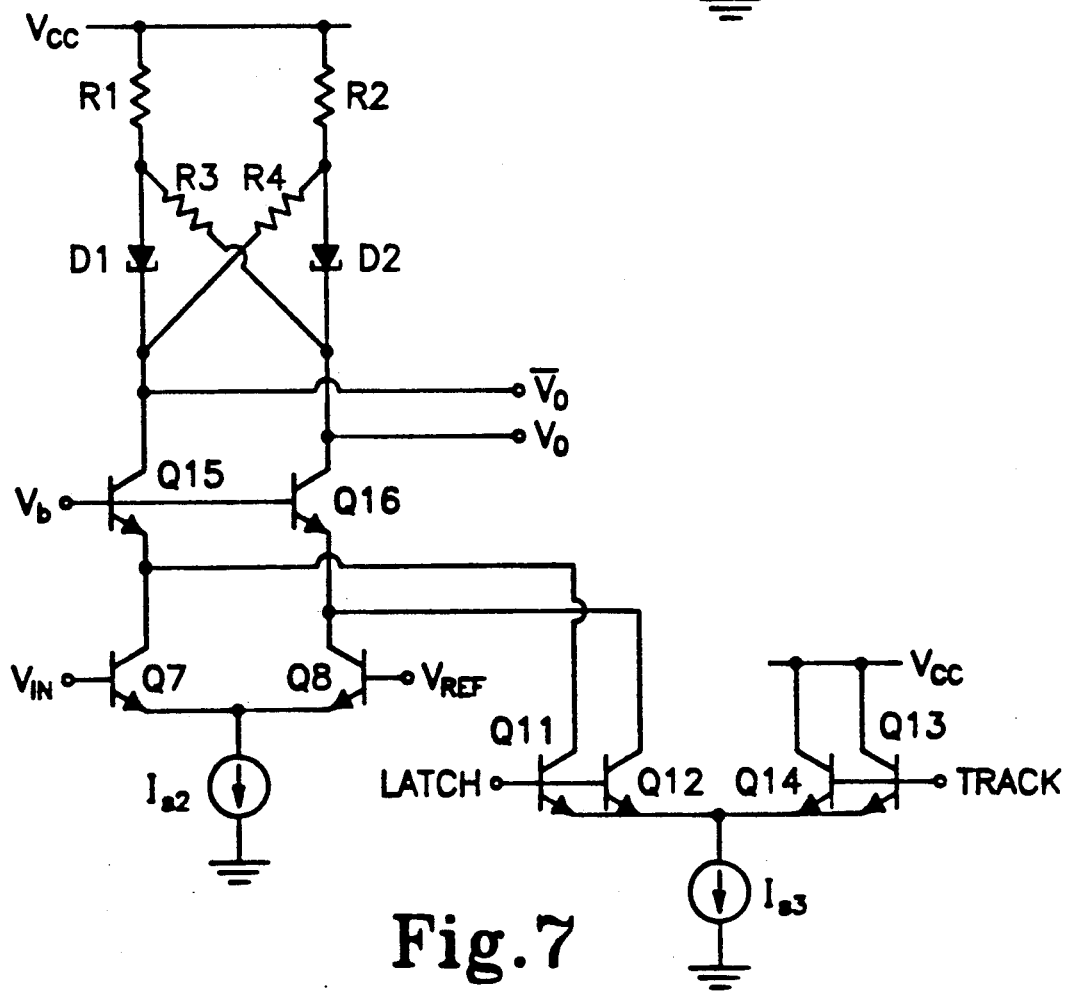

Another variation to speed up the circuit operation is illustrated in FIG. 7. This circuit is similar to that of FIG. 6, but includes two additional transistors Q15 and Q16 that are cascoded respectively with Q7 and Q8. The cascoded transistors Q15 and Q16 are biased into conduction by a bias voltage $V_b$, and reduce the impedance seen at the collectors of Q7, Q8, Q11 and Q12. The use of cascode transistors is a known technique for speeding up circuit operation that is also applicable to the present invention.

Figure 8:
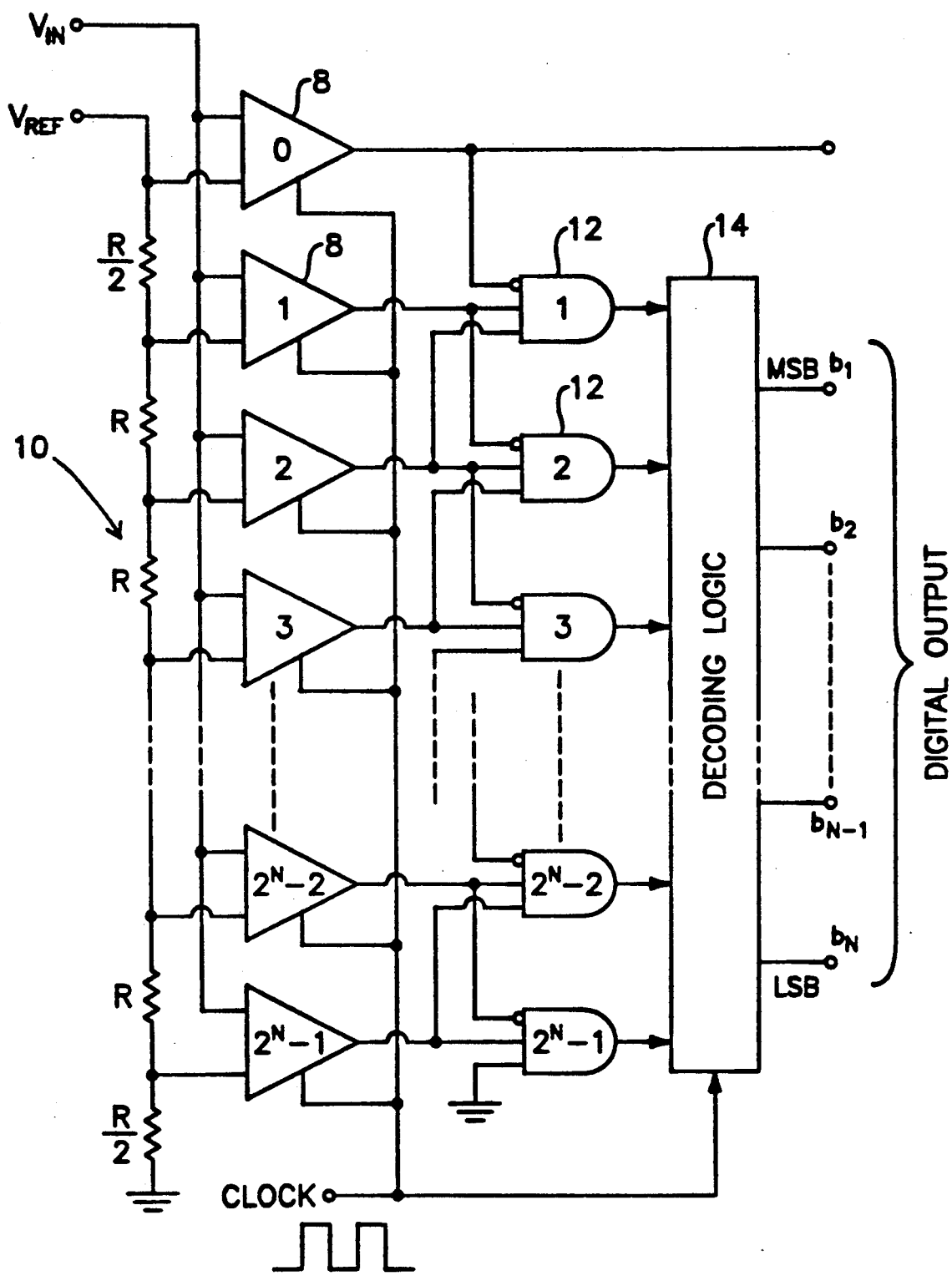
FIG. 8 is a block diagram of a parallel ADC to which the invention is applicable.

A conventional ADC in which the present invention may be used is shown in block diagram form in FIG. 8. A parallel ADC is shown. For N-bit resolution, $2^n-1$ separate comparators and separate reference levels are required. The system complexity thus increases rapidly as the number of parallel bits is increased. In this type of ADC, all input bits are processed simultaneously. The entire encoding operation can therefore be performed within one clock cycle. Because of this property, such ADCs are also referred to as "flash converters".

An analog input signal $V_{IN}$ is applied to one input terminal of each of $2^n-1$ latching comparators 8. The other inputs to the latching comparators are provided by a potentiometric resistor string 10 across which a reference voltage $V_{REF}$ is applied. Decremented voltage levels which correspond to individual quantizing levels are furnished by the resistor string to each of the comparators. At any given analog input level, the outputs of all comparators whose reference voltages are below $V_{IN}$ will be at the "one state", and those above $V_{IN}$ will be at the "zero state". In other words, the output of the comparator array is essentially a bar graph of a total of $2^n-1$ discrete points whose height is proportional to $V_{IN}$ (a thermometer code). The particular resistor segment in which $V_{IN}$ lies is determined by segment-detection logic consisting of a stack of AND gates 12. This level is detected by comparing the logic output of each comparator 8 with the ones immediately above and below it in a conventional manner. The resulting information is then decoded by decoding logic 14, consisting of a combinatorial logic circuit or a programmable logic array (PLA) to form an N-bit digital output word.

A CLOCK input, corresponding to the LATCH control signal in the previous figures, is applied to both the latching comparators 8 and the digital logic circuitry 14. Although the entire conversion process can theoretically be performed in a single clock cycle, in practice two clock cycles are used: one to sample the input level and latch the comparator circuits 8, and the second to complete the decoding operation. In "pipeline" architecture that allows for a higher switching rate in the decoding logic, additional latching comparator circuits are used as digital storage registers in the decoding logic circuitry. The latching comparator circuits of FIGS. 5–7 can be used for this purpose also.

In practice, all signals on the ADC chip should be routed on controlled impedance transmission lines, and each subcircuit individually decoupled with on-chip decoupling capacitors. Separate clock inputs should be provided for the input latching comparators and the output decoding logic. This allows the ADC output to be clocked at a sub-multiple of the input sample frequency. In this configuration the data can be output at a lower rate than the comparators, while the comparators operate at their full input speed. This makes it possible to test the distortion performance at full speed operation.

Figure 9:
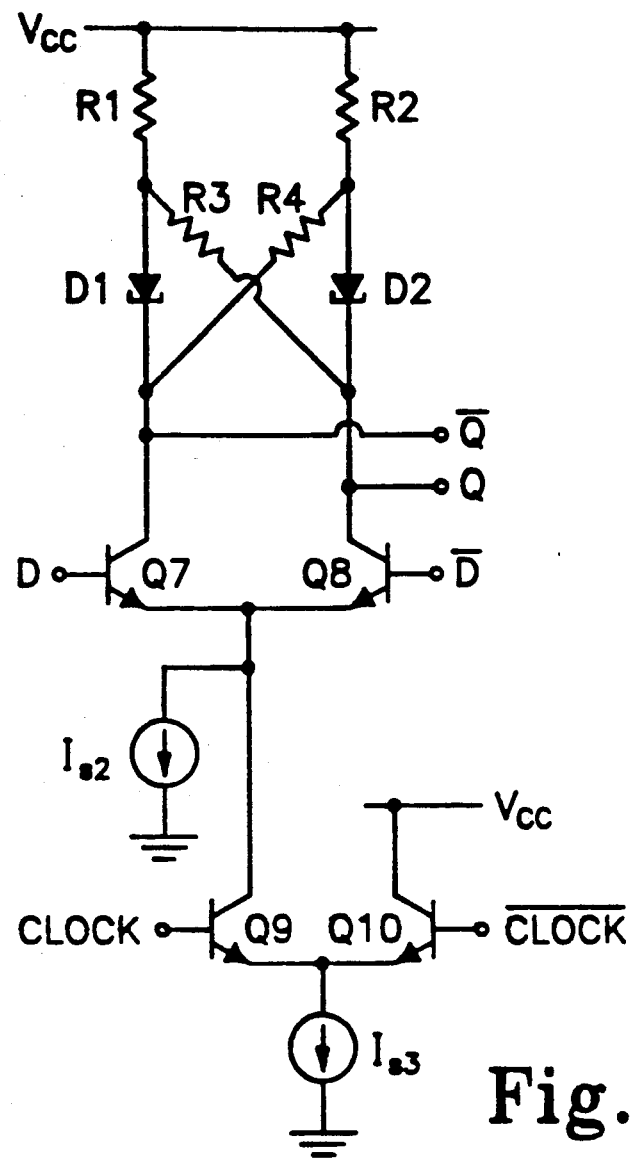
FIG. 9 is a circuit diagram of the invention as applied to a data latch.

The new latching comparator circuit has numerous applications other than ADCs, including data latches and flip-flop circuits. A D-type data latch is shown in FIG. 9. It is essentially the same as the FIG. 5 circuit, but the inputs to Q7 and Q8 are data values D and $\overline{D}$, while the outputs taken from their collectors are Q and $\overline{Q}$. The switching bias signals for Q9 and Q10 are indicated as CLOCK and $\overline{CLOCK}$, rather than LATCH and TRACK for the ADC.

Figure 10:
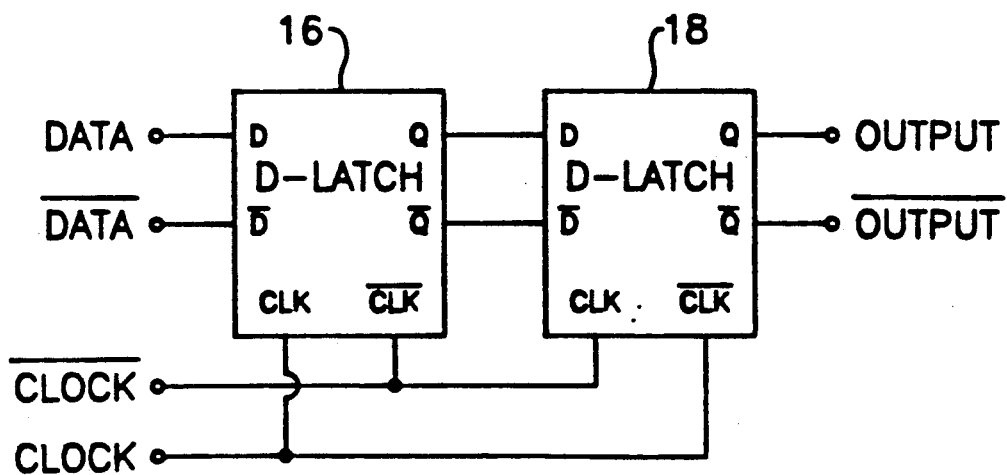
FIG. 10 is a block diagram of a flip-flop circuit utilizing the invention.

The use of a pair of data latches 16, 18, to form a flip-flop circuit is shown in FIG. 10. DATA and $\overline{DATA}$ signals are applied to the first latch 16, while output and $\overline{output}$ signals are obtained from the second latch 18. The Q and $\overline{Q}$ outputs of the first latch 16 are connected respectively to the D and $\overline{D}$ inputs to the second latch 18, with out-of-phase CLOCK and $\overline{CLOCK}$ signals applied to each latch. As with the latching comparator circuit, significant improvement in operating speed can be achieved.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A high speed latching comparator, comprising:
a pair of latching devices characterized by higher and lower voltage regions of positive electrical impedance separated by negative electrical impedance, said latching devices triggering from their lower to their higher voltage regions of positive impedance in response to their currents exceeding a trigger level, and having respective input and output sides,
a pair of hysteresis elements connected in circuit with said latching devices for maintaining said devices when triggered in their higher voltage regions of positive impedance at a lower voltage than the initial higher voltage region trigger voltage,
a pair of impedance elements cross-coupling the input and output sides of said latching devices for enabling one latching device to be latched in its high voltage state while diverting current away form the non-latching device, thereby preventing the non-triggering latching device from latching in its high voltage region of positive impedance,
first current source means for supplying a current,
first steering circuit means coupled between said latching devices and said current source means for providing a differential current to said latching devices, said first steering circuit means comprising a pair of transistors differentially connected, with one transistor connected to each latching device, wherein one transistor is biased by an input signal and the other transistor is biased by a reference signal, wherein said differential current is proportional to the difference between said input signal and said reference signal, and
a second current steering circuit coupled to said first steering circuit means for modifying said differential current between said latching devices such that one of the latching devices is triggered into its high voltage region of positive impedance.

2. The comparator of claim 1 wherein said latching devices comprise tunnel diodes.

3. The comparator of claim 1 wherein said hysteresis elements comprise impedances connected in series with their respective latching devices.

4. The comparator of claim 1 wherein said second steering circuit comprises a pair of transistors differentially connected and respectively biased by LATCH and TRACK signals, and a second current source for supplying additional current to said first steering circuit.

5. The comparator of claim 1 wherein said second steering circuit is coupled between said latching devices and said first steering circuit means.

6. The comparator of claim 5 further comprising two cascode transistors cascoded respectively between said first steering circuit transistors and said latching devices.

7. The comparator of claim 1 wherein said transistors comprise NPN heterojunction bipolar devices and wherein said latching devices comprise resonant tunneling diodes.

* * * * *